(12) United States Patent
Segrest

(10) Patent No.: US 11,483,198 B2
(45) Date of Patent: Oct. 25, 2022

(54) WIRELESS MULTI-PORT METER PROGRAMMING AND TESTING DEVICE

(71) Applicant: Neptune Technology Group Inc., Tallassee, AL (US)

(72) Inventor: Brandon Segrest, Auburn, AL (US)

(73) Assignee: Neptune Technology Group Inc., Tallassee, AL (US)

(*) Notice: Subject to any disclaimer, the term of this patent is extended or adjusted under 35 U.S.C. 154(b) by 151 days.

(21) Appl. No.: 16/990,102

(22) Filed: Aug. 11, 2020

(65) Prior Publication Data

US 2021/0092011 A1  Mar. 25, 2021

Related U.S. Application Data

(60) Provisional application No. 62/902,542, filed on Sep. 19, 2019.

(51) Int. Cl.
*H04L 41/0806* (2022.01)
*G01F 15/063* (2022.01)
*G01R 21/00* (2006.01)

(52) U.S. Cl.
CPC ........ *H04L 41/0806* (2013.01); *G01F 15/063* (2013.01); *G01R 21/007* (2013.01)

(58) Field of Classification Search
None
See application file for complete search history.

(56) References Cited

U.S. PATENT DOCUMENTS

| | | | |
|---|---|---|---|
| 7,605,717 B2 | 10/2009 | Olson et al. | |
| 7,668,670 B2 | 2/2010 | Lander | |
| 7,891,246 B2 | 2/2011 | Lander | |
| 8,126,665 B1 | 2/2012 | Whitson | |
| 8,188,885 B2 | 5/2012 | Beverung et al. | |
| 8,866,634 B2 | 10/2014 | Williamson et al. | |
| 9,400,193 B2 | 7/2016 | Whitson, Jr. | |
| 2004/0113810 A1 | 6/2004 | Mason, Jr. et al. | |
| 2007/0130408 A1* | 6/2007 | Leach | H04Q 9/00 710/305 |

* cited by examiner

*Primary Examiner* — Adolf Dsouza
(74) *Attorney, Agent, or Firm* — Snyder, Clark, Lesch & Chung, LLP

(57) ABSTRACT

A meter communication interface device includes a radio frequency (RF) communication unit, multiple different types of communication ports, and a controller. The RF communication unit receives, via RF signaling, at least one of first commands, instructions or data destined for a first meter encoder, meter, or meter interface unit (MIU). The controller selects a first communication port from the multiple different types of communication ports, and sends, via the selected first communication port using a first communication mechanism, the at least one of first commands, instructions or data to the first meter encoder, meter, or MIU.

27 Claims, 11 Drawing Sheets

WIRELESS MULTI-PORT METER PROGRAMMING AND TESTING DEVICE

CROSS-REFERENCE TO RELATED APPLICATION

This application claims priority under 35 U.S.C. § 119, based on U.S. Provisional Application No. 62/902,542, filed Sep. 19, 2019, the disclosure of which is hereby incorporated by reference herein.

BACKGROUND

Meter encoders includes devices that take metering data, such as water meter flow data, power meter consumption data, gas meter consumption data, etc., and convert the data into an electronic format for storage and transmission to industrial network systems, or other network endpoints. Meter encoders are often tested in the field to verify functionality and accuracy. Additionally, meter encoders often require configuration and/or programming to ensure proper operation. A dedicated hand-held computer, designed for use with a particular meter encoder, typically has been used in the field to connect to a meter encoder, via a serial communications cable, to perform meter encoder testing, configuring, or programming. To use the dedicated handheld computer with new models of meter encoders, or different types of meter encoders, software and/or hardware modifications are often necessary. In addition, during field use, the serial communications cable often catches on objects, and can become easily unplugged or damaged under typical field conditions.

DETAILED DESCRIPTION

The following detailed description refers to the accompanying drawings. The same reference numbers in different drawings may identify the same or similar elements. The following detailed description does not limit the invention.

A meter communication interface device is described herein that enables multiple different types of meter encoders, each possibly having a different type of communication port, to communicate with a controlling device for purposes of testing, configuring, meter reading, or programming. The meter communication interface device additionally includes a wireless radio frequency communication capability for wirelessly communicating with the controlling device, such as a hand-held computer or smart phone. In one implementation, the wireless radio frequency communication capability may include a communication unit that communicates using a low power, short range communication protocol, such as Bluetooth™. In other implementations, various other types of existing wireless radio frequency communication mechanisms and protocols may be used. The meter communication interface device includes multiple different communication ports, each employing a different type of communication mechanism, which may optionally be selected for use with different meter encoders. The multiple different communication ports may include, for example, an infrared port for communicating with a meter encoder using infrared signaling, an inductive port (e.g., a Near Field Communication (NFC) port) for communicating with a meter encoder using inductive signaling, a radio frequency port for communicating with a meter encoder using radio frequency signaling, and a wired port (e.g., a serial communication port) for communicating with a meter encoder using electrical signaling The multiple ports of the interface device may, however, include other types of communication ports.

The meter communication interface device may serve as an interface for relaying meter testing, configuration, reading, or programming commands, instructions, or data between the controlling device and multiple different meter encoders that each may have a different type of wireless or wired communication port. The meter communication interface device described herein may, thus, act as a "universal" interface device for wirelessly connecting a controlling device to multiple different types of meter encoders having different types of communication ports. For example, the universal nature of the interface device enables the device to obtain meter readings from different types of meters (e.g., water meters, power meters, gas meters) connected or coupled to respective meter encoders that are further connected to the interface device.

Figure 1:
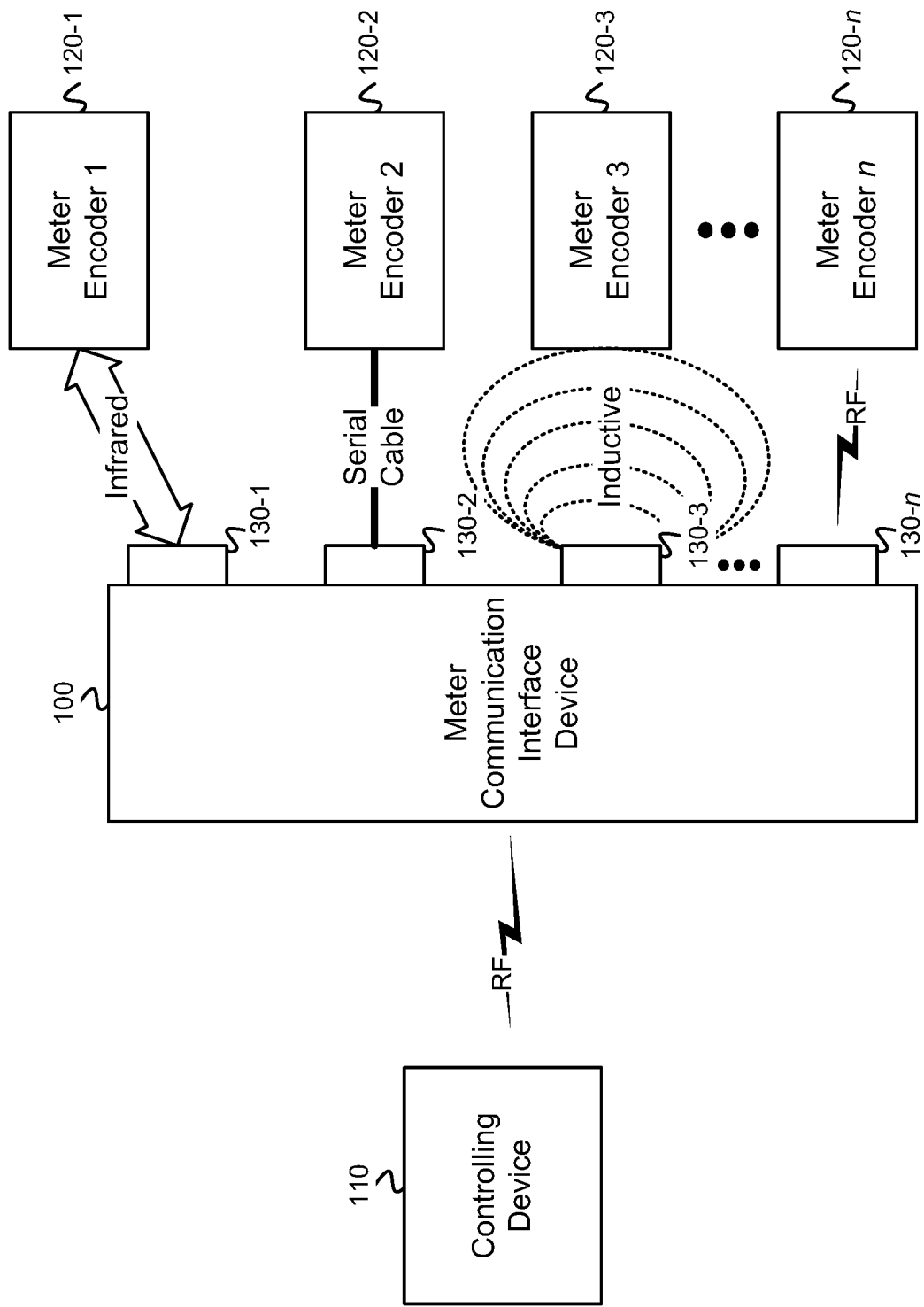
FIG. 1 depicts a block diagram of an exemplary implementation of a multi-port meter communication interface device that may be used for programming and/or testing meter encoders having multiple different types of communication ports.

FIG. 1 depicts a block diagram of an exemplary implementation of a multi-port meter communication interface device 100 (referred to herein as "meter communication interface device 100" or "interface device 100") that may be used for programming and/or testing meter encoders 120-1 through 120-$n$ (individually referred to herein as "meter encoder 120" or collectively referred to herein as "meter encoders 120") having multiple different types of communication ports. Though not shown in FIG. 1, each of the meter encoders 120 may be associated with (e.g., connected or coupled to) a respective meter, such as, for example, a water meter, a gas meter, a power meter, etc. Additionally, though not shown in FIG. 1, one or more of meter encoders 120-1 through 120-$n$ may be associated with, or integrated with, a meter interface unit (MIU) that may enable communication between the meter and/or meter encoder and an external device or system (e.g., between the meter and/or meter encoder and interface device 100). As shown, a controlling device 110 may connect to meter communication interface device 100 via, for example, a radio frequency (RF) connection and provide commands, instructions, and/or data to meter communication interface unit 100 for programming, configuring, and/or testing meter encoders 120-1 through 120-n, for reading meters associated with meter encoders 120-1 through 120-n, for programming, configuring, and/or testing MIUs associated with meter encoders 120-1 through 120-n, and/or for configuring, testing, or programming interface device 100 itself. In one implementation, the RF connection between controlling device 110 and interface device 100 may include a Bluetooth™ connection (e.g., a Bluetooth™ low energy (BLE) serial link). Other types of RF connections may, however, be established between controlling device 110 and interface unit 100.

Controlling device 110 may include any type of a computational device with a user interface and RF communication capability. For example, controlling device 110 may include a tablet computer (or other type of hand-held computer), a laptop computer, a smart phone, or a wearable computer (e.g., a "smart" watch, "smart" eyeglasses, etc.). Though only a single controlling device 110 is shown in FIG. 1, multiple different controlling device 110 may connect to meter communication interface device 100. For example, meter communication interface device 100 may connect, via the RF connection, to different controlling devices 110 at different points in time (e.g., connect to a computer_1 via an RF connection over time_period_1, and connect to a smart phone_2 via an RF connection over time_period_2).

As shown in FIG. 1, interface device 100 may include multiple different types of communication ports 130-1 through 130-n (referred to individually herein as "communication port 130" or collectively as "communication ports 130") enabling connections with meter encoders 120 (or with the associated meters or MIUs) via n different types of communication mechanisms (where n is any positive integer greater than or equal to two). Communication ports 130 may have, for example, infrared, wired, inductive, or RF communication capability. In the exemplary implementation depicted in FIG. 1, interface device 100 includes an infrared port 130-1 for communicating with meter encoder 120-1 using infrared signaling; a wired port 130-2 for communicating with meter encoder 120-2 using electrical signals over a wired connection (e.g., a serial cable); an inductive port 130-3 for communicating with meter encoder 130-3 using inductive signaling; and an RF port 130-n for communicating with meter encoder 130-n using RF signaling. Interface device 100 may select any one of output ports 130-1 through 130-n for communicating with a particular meter encoder 120 having a given type of communication port. Interface device 100 may, thus, serve as a "universal" communication interface unit that enables a controlling device 110 to wirelessly connect with multiple different types of meter encoders 120 having various different types of input ports. Though only four ports (130-1, 130-2, 130-3, and 130-n) are depicted in FIG. 1, interface device 100 may any number of ports greater than or equal to two (e.g., 5 ports, 6 ports, etc.). Additionally, interface device 100 may have different types of ports 130 than those shown in FIG. 1.

Figure 2:
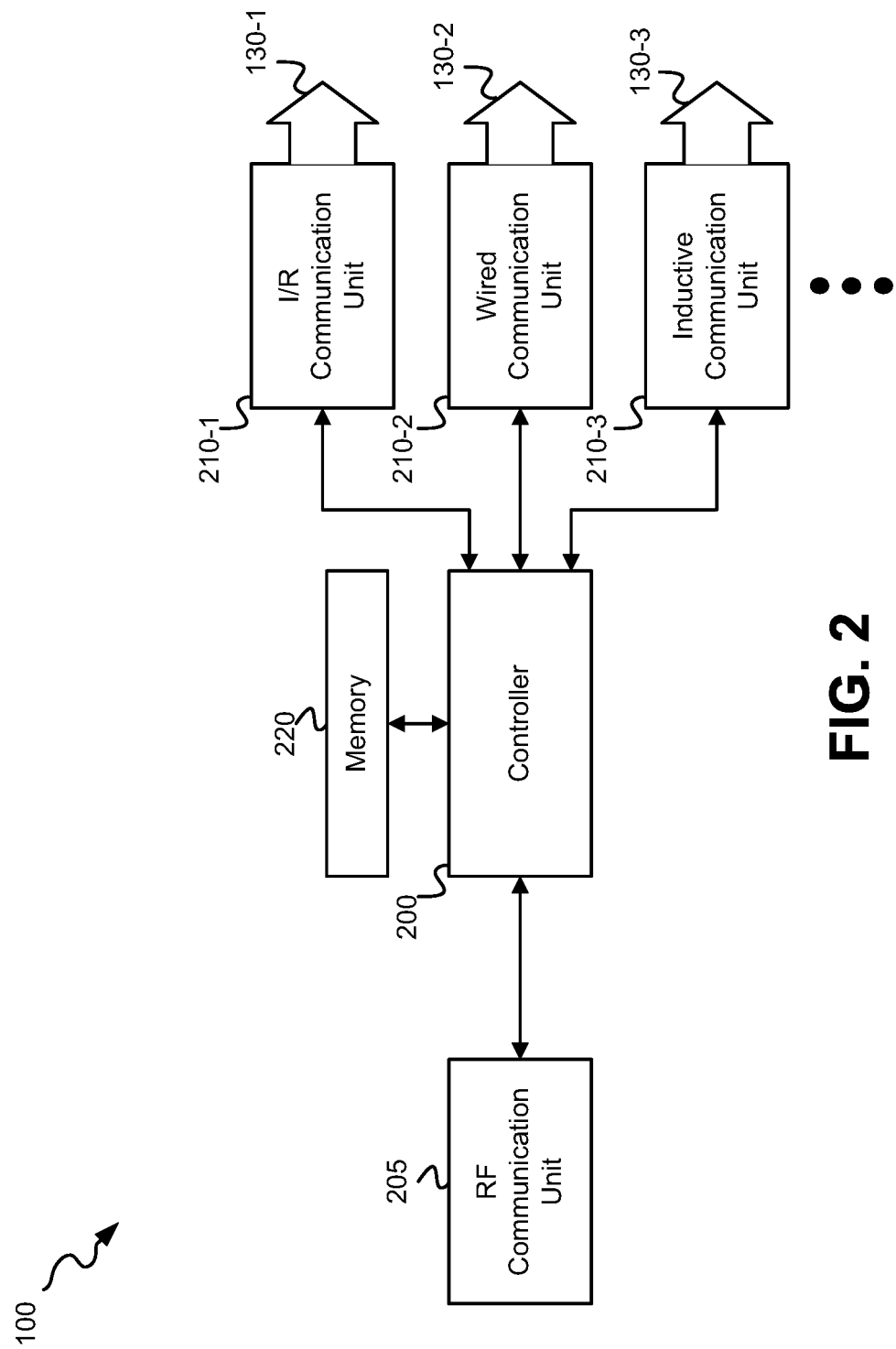
FIG. 2 depicts exemplary components of a meter communication interface device.

FIG. 2 depicts exemplary components of meter communication interface device 100. Interface device 100 may include a controller 200, a RF communication unit 205, communication units 210-1 through 210-n (only units 1-3 shown), and a memory device 220.

Controller 200 may include one or more processors or microprocessors that interpret and execute instructions, and/or may include logic circuitry (e.g., a field-programmable gate array (FPGA)) that executes one or more processes/functions. Controller 200 may include software, hardware, or a combination of software and hardware for executing processes described herein. In some implementations, controller 200 may implement a secure bootloader for reconfiguring interface device 100. Memory 220 may store the instructions executed by controller 200 for the processes described herein. Memory 220 may, in some implementations, additionally implement a quick activation queue, described below with respect to FIG. 4, which queues commands, instructions, and/or data being sent from controlling device 110 to one or more particular meter encoders 120.

RF communication unit 205 may include a transceiver that can wirelessly communicate with controlling device using RF. In one implementation, RF communication unit 205 may include a Bluetooth™ transceiver for communicating with controlling device 110 using a BLE serial link. Communication units 210 may include multiple different types of transceivers, or communication circuitry, for communicating with different meter encoders (or with meters or MIUs) using infrared, electrical, inductive, RF, or other types of communication mechanisms. In the exemplary implementation shown, communication units 210 include an infrared (I/R) communication unit 210-1, a wired communication unit 210-2, and an inductive communication unit 210-3. I/R communication unit 210-1 includes transceiver circuitry for communicating with a meter encoder via I/R. Wired communication unit 210-2 includes transceiver circuitry for communicating with a meter encoder via wired electrical signals (e.g., via a serial cable). Inductive communication unit 210-3 includes circuitry for communicating to/from a meter encoder via inductive signaling.

The configuration of components of interface device 200 illustrated in FIG. 2 is for illustrative purposes only. Other configurations may be implemented. Therefore, interface device 100 may include additional, fewer and/or different components, arranged in a different configuration, than depicted in FIG. 2. For example, interface device 100 may include a rechargeable battery for powering the device 100 that is not shown in FIG. 2. The rechargeable battery may have a certain number of sessions per battery charge (e.g., 1000 sessions/charge).

Figure 3A:
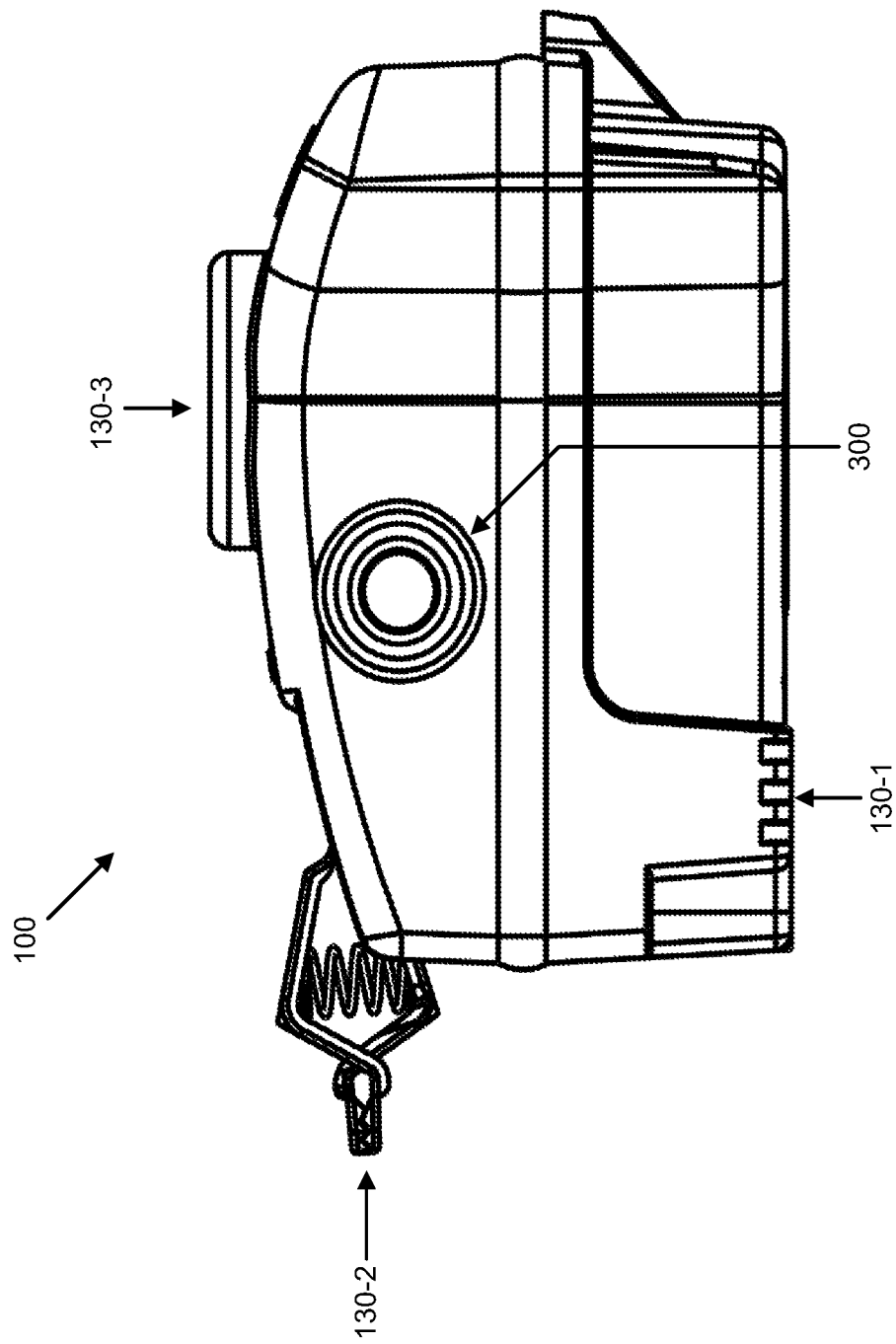
FIGS. 3A and 3B depict two views of an exemplary physical configuration of a housing, and communication ports, of the meter communication interface device of FIG. 2.
Figure 3B:
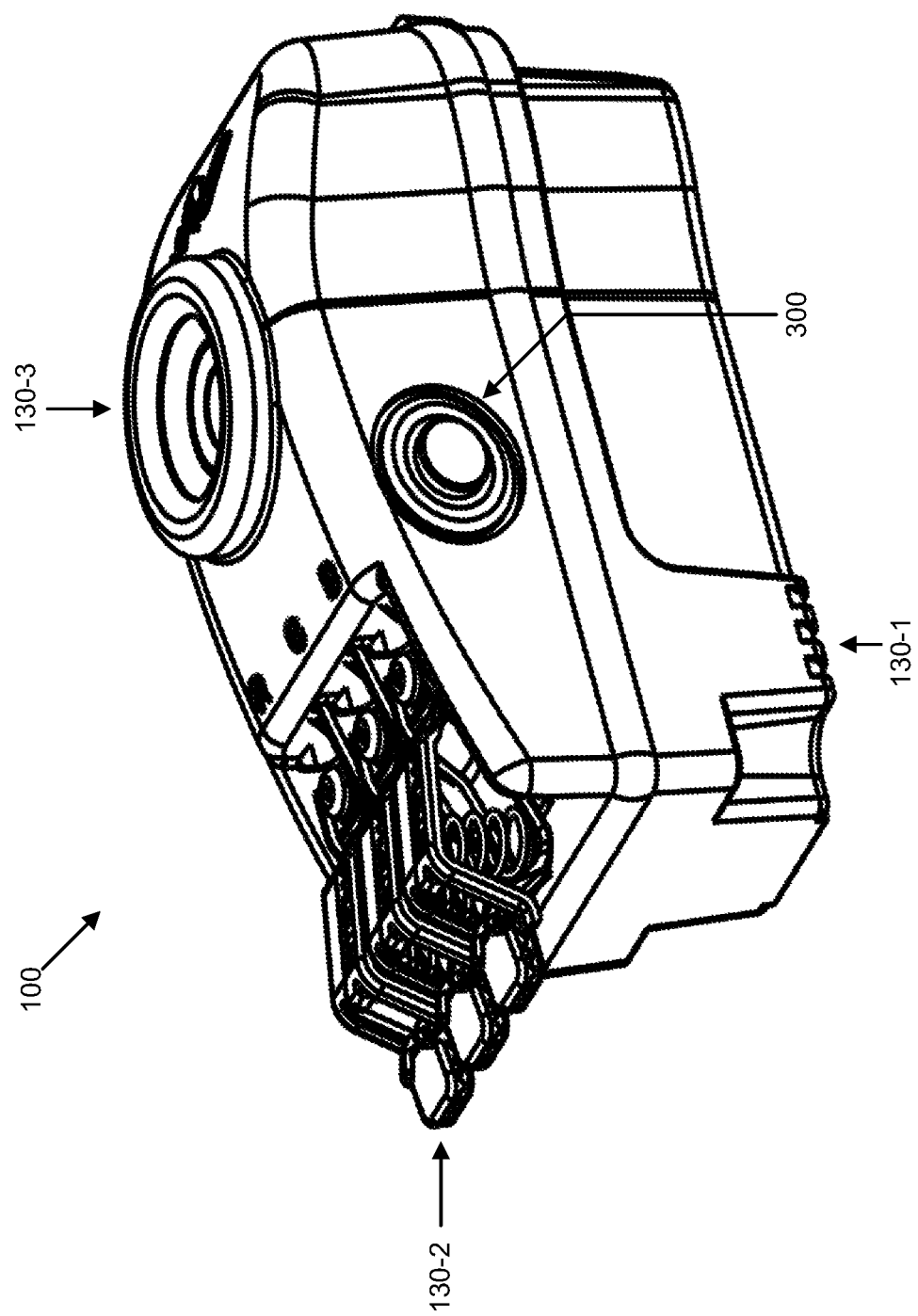

FIGS. 3A and 3B depict two views of an exemplary physical configuration of a housing, and communication ports, of meter communication interface device 100. As shown, the housing includes I/R port 130-1, wired port 130-2, and inductive port 130-3 disposed on various surfaces of the housing. In the configuration shown in FIGS. 3A and 3B, FR port 130-1 is disposed on a lower surface of the housing, wired port 130-2 is disposed on one end of an upper surface of the housing, and inductive port 130-3 is disposed on another end of the upper surface of the housing. The housing of interface device 100 may be designed to be water resistant (e.g., Ingress Protection (IP)-03 water resistant). The housing additionally includes quick activation selector switch 300 disposed on one side that enables the user/operator of interface device 100 to execute a quick activation function previously configured by controlling device 110. Pressing quick activation selector switch 300, by the user/operator, causes interface device 100 to retrieve a command(s), instruction set(s), and/or data from a quick activation queue (described below) stored in memory 220, or stored in a memory of controlling device 110, for use in configuring, programming, reading, and/or testing a particular connected meter encoder 120, meter, or MIU.

Figure 4:
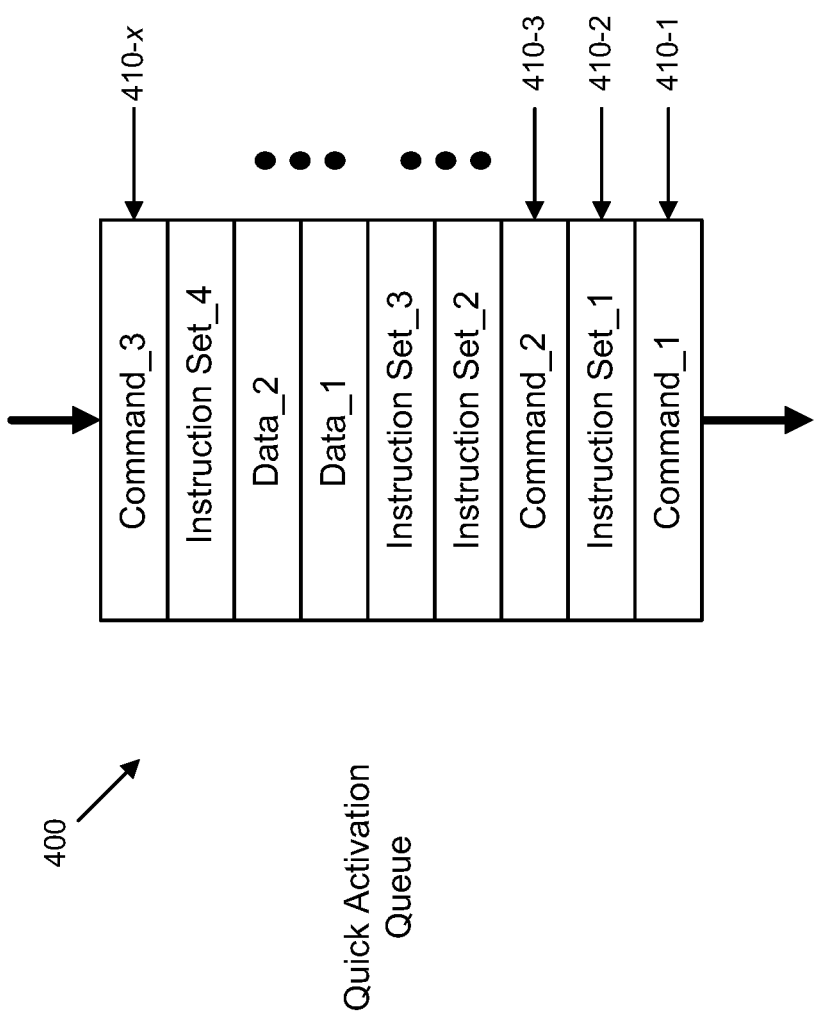
FIG. 4 illustrates an exemplary quick activation queue that may be stored in a memory of the meter communication interface device of FIG. 2.

FIG. 4 illustrates an exemplary quick activation queue 400 that may, in some implementations, be stored in memory 220 of interface device 100. Alternatively, in other implementations, quick activation queue 400 may be stored in a memory of controlling device 110. Queue 400 may be implemented as, for example, a first-in-first-out (FIFO) queue that stores each command, instruction set, and/or data, entered/selected by a user at controlling device 110, in an order in which it is received. For example, a 1) first command, 2) an instruction set, and 3) a second command, received at interface device 100 may be stored in queue entry 410-1, queue entry 410-2, and queue entry 410-3, respectively, of quick activation queue 400. A user of controlling device 110 may select one or more commands, instruction sets, and/or data to be sent, in some implementations, via the RF connection between controlling device 110 and meter communication interface device 100 for storage in quick activation queue 400. In other implementations, the user of controlling device 110 may select one or more commands, instruction sets, and/or data for storage in quick activation queue 400 in a memory at the controlling device 110. The user of controlling device 110 may, thus, store a sequence of commands, instructions, and/or data in queue 400 for subsequent use by the user (or by another user) via selection (e.g., the user pressing) of quick activation button 300 (not shown in FIG. 4) of meter communication interface device 100. Selection of quick activation button 300 may result in retrieval of one or more commands, instructions, and/or data from the "top" of queue 400 and sending of the retrieved commands, instructions, and/or data to a destination meter encoder 120 for programming, configuring, or testing the meter encoder 120.

Figure 5:
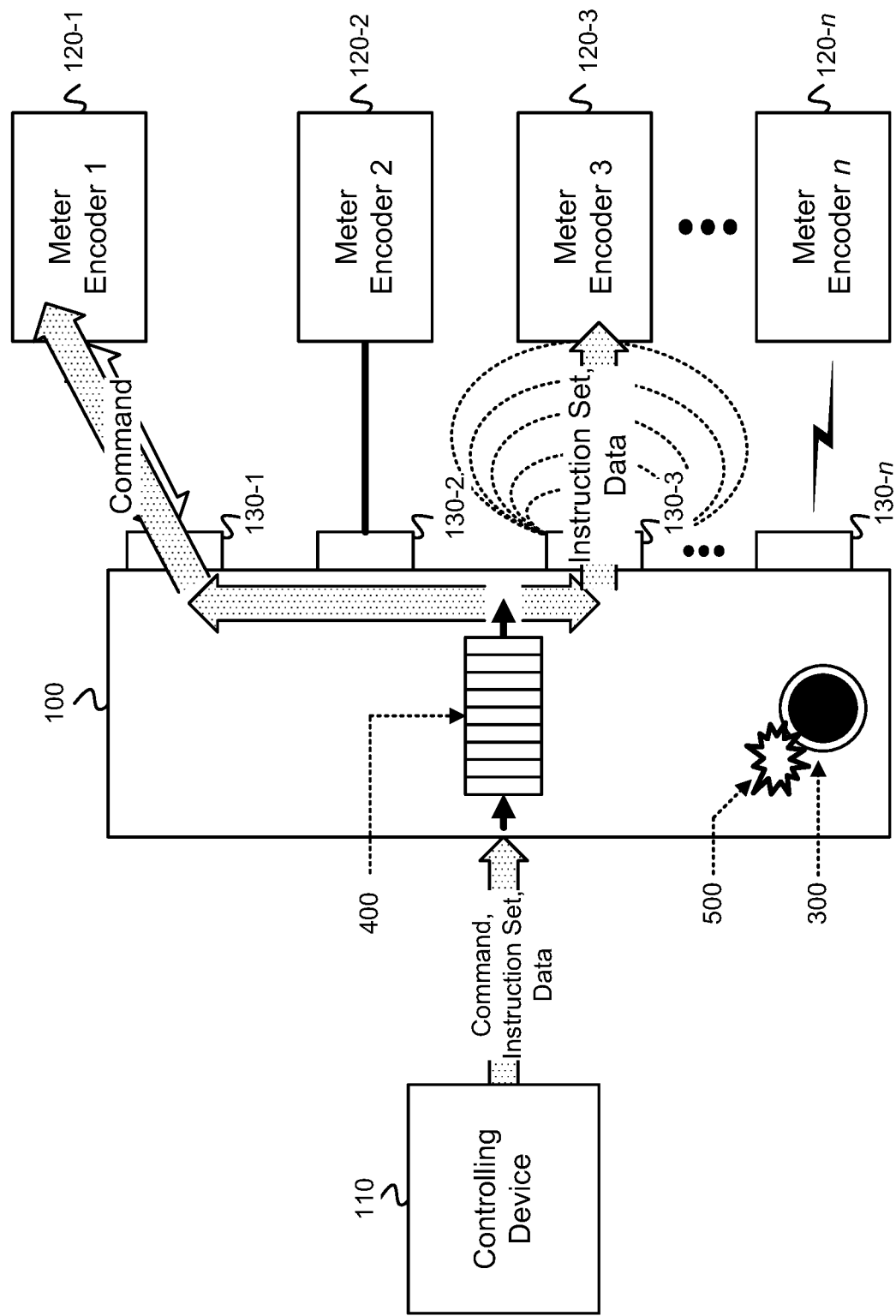
FIG. 5 illustrates an example of the storage and activation of commands, instructions, and/or data within, or from, the quick activation queue of FIG. 4 stored in the meter communication interface device of FIG. 2.

FIG. 5 illustrates one example of the storage and activation of a command, instruction set, and data within or from quick activation queue 400 of meter communication interface device 100. In the example of FIG. 5, quick activation queue 400 is shown as being stored in memory in meter communication interface device 100. In other implementations, quick activation queue 400 may be stored in a memory of controlling device 110, and a command(s), instruction set(s), and/or data may be retrieved from the "top" of quick activation queue 400 in the memory of controlling device 110 upon selection of quick activation button 300 by a user of meter communication interface device 100. As shown, a command, an instruction set, and data for one or more operations or functions to be executed may be sent from controlling device 110 to quick activation queue 400 at interface device 100. The command, instruction set, and data may then be queued in a FIFO manner in queue 400. Upon a first selection 500 of quick activation button 300, the command may be retrieved from the top entry of queue 400 and sent, for example, to a destination meter encoder 120-1 connected to interface device 100 via infrared port 130-1.

Upon a second selection 500 of quick activation button 300, the instruction set and data may be retrieved from the top entry of queue 400 and sent, for example, to a destination meter encoder 120-3 connected to interface device 100 via inductive port 130-3. Any sequence of commands, instructions, and/or data may be selected for storage in queue 400 by a user of controlling device 110 for quick activation, using quick activation button 300, for sending to one or more meter encoders connected to interface device 100 via ports 130-1 through 130-n. Alternatively, the commands, instructions, and/or data selected for storage in queue 400, when activated using quick activation button 300 may cause interface device 100 itself to execute one or more operations or functions, based on the retrieved commands, instructions, and/or data previously supplied to device 100.

Figure 6A:
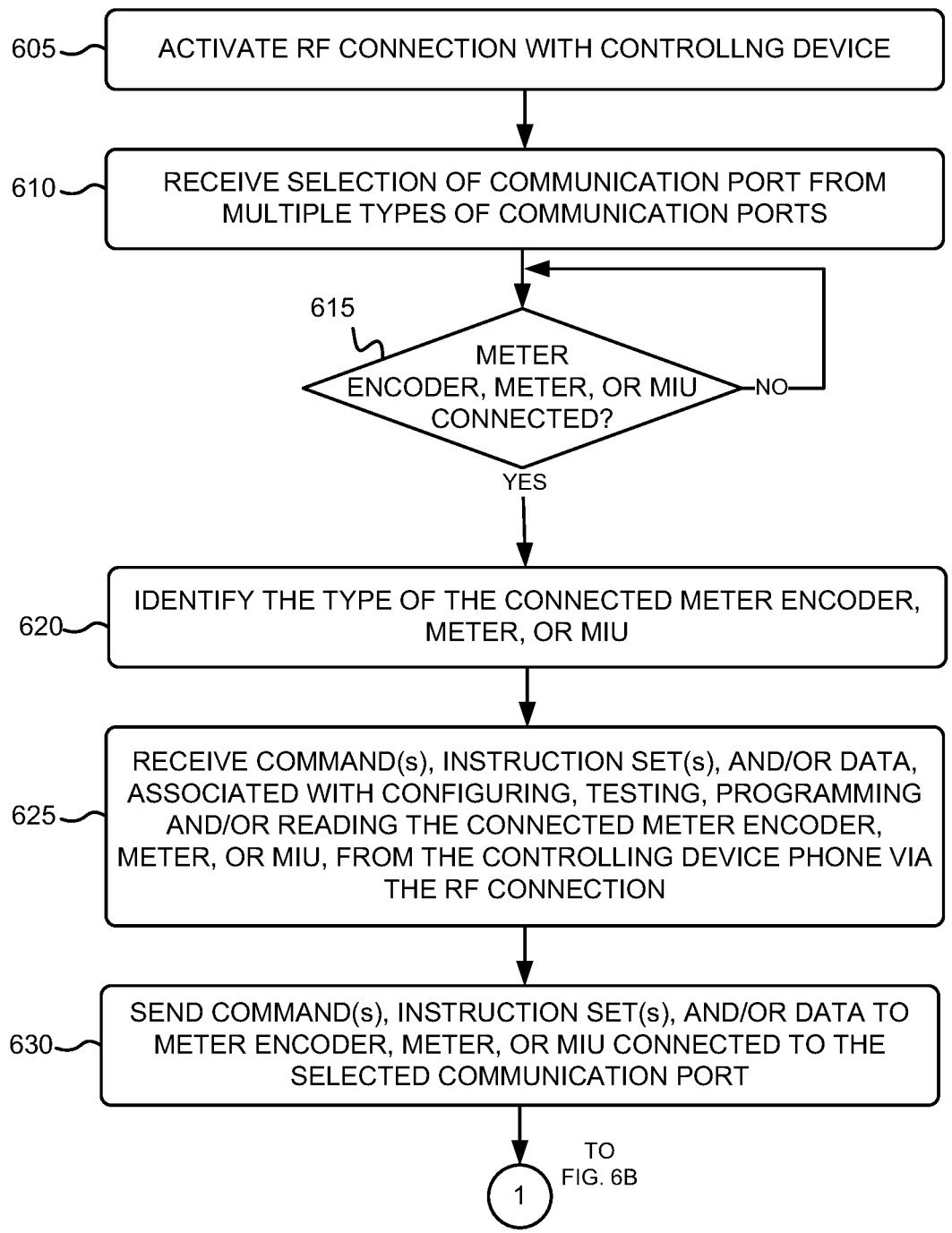
FIGS. 6A and 6B are flow diagrams that illustrate an exemplary process for configuring, testing, programming and/or reading a meter encoder by a controlling device using the meter communication interface device of FIG. 2.
Figure 6B:
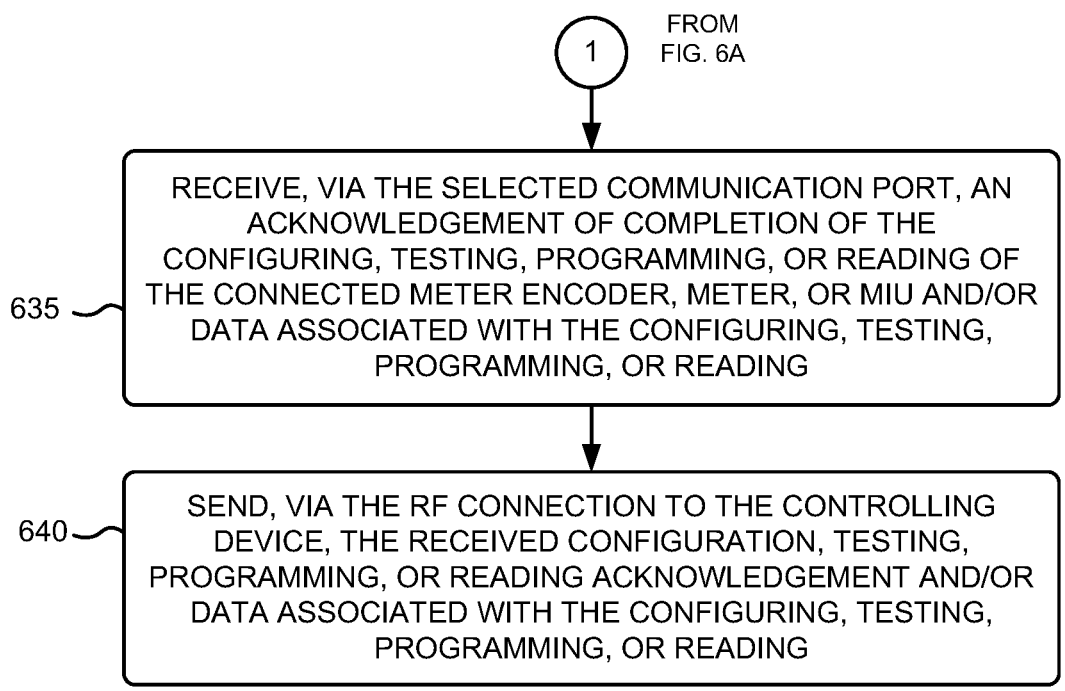

FIGS. 6A and 6B are flow diagrams that illustrate an exemplary process for configuring, testing, and/or programming a meter encoder 120 by a controlling device 110 using meter communication interface device 100. The exemplary process of FIGS. 6A and 6B may additionally be used for configuring, testing, reading and/or programming a meter associated with a meter encoder 120, or for configuring, testing, and/or programming a MIU associated with a meter or meter encoder 120. The exemplary process of FIGS. 6A and 6B may be implemented by interface device 100 in conjunction with a controlling device, such as controlling device 110.

The exemplary process includes interface device 100 activating an RF connection with controlling device 110 (block 605). Interface device 100 may activate a connection between RF communication unit 205 and controlling device 110. For example, if the RF connection includes a Bluetooth™ connection, and Bluetooth™ mode has been turned on at controlling device 110, RF communication unit 205 may "pair" with controlling device 110 to establish an RF Bluetooth™ connection.

Interface device 100 receives a selection of a communication port from multiple types of communication ports (block 610). In one implementation, controlling device 110 may send a selection of a communication port, from among ports 130-1 through 130-n, that is to be used to connect interface device 100 to a particular meter encoder 120, meter, or MIU. A user of controlling device 110 may, for example, enter the selection of the communication port via a graphical user interface (GUI) implemented in controlling device 110 (e.g., select a particular communication port via a GUI menu), and the selection may be transmitted to interface device 100 via RF communication unit 205. The GUI may facilitate easy entry of communication port selections, and other information, in controlling device 110 for transmission to interface device 100. In another implementation, interface device 100 may "test" each of communication ports 130-1 through 130-n for the presence of a meter encoder 120, meter, or MIU, and may select one of the communication ports 130-1 through 130-n based on detection of the presence of the meter encoder 120, meter, or MIU via the selected one of the communication ports 130. For example, referring to FIG. 5, interface device 100 may send a probe signal(s) to each of ports 130-1 through 130-2 (e.g., sequentially) to detect a responsive signal from a meter encoder 120, a meter, or MIU via one or more of the ports 130. If a response is received via a particular port 130, indicating the presence of a meter encoder 120, a meter, or MIU, then interface device 100 selects that particular port for communicating with the meter encoder 120, meter or MIU for sending a command(s), instruction set(s), and/or data (as described with respect to block 630 below).

Interface device 100 determines if a meter encoder, meter, or MIU has been connected to the selected communication port (block 615). In the case of infrared port 130-1, connection of the meter encoder 120-1 may include placement of interface device 100 in proximity to the meter encoder 120-1, with an unhindered line of sight between infrared port 130-1 and a corresponding infrared port on the meter encoder 120-1. In the case of wired port 130-2, connection of the meter encoder 120-2 may include insertion of one end of a cable (e.g., a serial cable) into wired port 130-2 and the other end of the cable into the corresponding wired port of the meter encoder 120-2. In the case of inductive port 130-3, connection of the meter encoder 120-3 may include placement of inductive port 130-3 of interface device 100 in close proximity to the corresponding inductive port of the meter encoder 120-3. Interface device 100 and the selected meter encoder 120, meter, or MIU may then engage in a "handshake," via the selected communication port 130, to establish a connection between interface device 100 and the meter encoder 120, meter, or MIU.

If a meter encoder 120, meter, or MIU has not yet been connected to the selected communication port (NO—block 615), interface device 100 waits until the meter encoder 120, meter, or MIU is connected. If the meter encoder 120, meter, or MIU has been connected (YES—block 615), then interface device 100 identifies the type of the connected meter encoder, meter, or MIU (block 620). Interface device 100 may, for example, query the meter encoder 120 to obtain an identifier of the meter encoder 120 that can be used to determine the type of the meter encoder 120.

Interface device 100 receives a command(s), instruction set(s), and/or data, associated with configuring, testing, programming, or reading the connected meter encoder 120, meter, or MIU, from controlling device 110 via the RF connection (block 625). In some circumstances, a user of controlling device 110 may, based on the type of configuration, testing, programming, or meter reading to be performed or based on the type of meter encoder (e.g., the model of the meter encoder, the version of the meter encoder, etc.), meter or MIU, select one or more particular commands, instruction sets, and/or data to be sent to the meter encoder 120. The type and content of the command(s), instruction set(s) and/or data may be dependent on the meter encoder, meter, or MIU configuration, testing, programming, or meter reading that the user desires to have performed. In other circumstances, controlling device 110 may automatically select one or more particular commands, instructions sets, and/or data depending on the type of the meter encoder 120 determined in block 620 and based on the type of configuring, testing, programming, or meter reading to be performed.

In one implementation, configuring the connected meter encoder 120, meter, or MIU may include setting, or changing, a "mode" of the meter encoder 120, meter, or MIU when the meter encoder 120, meter, or MIU may be capable of operating in multiple different modes. A "mode," as used herein, refers to one of multiple different modes of operation of the meter encoder 120, meter or MIU. For example, a particular meter encoder 120 may be capable of operating in three different modes: a basic mode, an advanced mode, and a pro mode. In the basic mode, the meter encoder 120 may collect hourly meter data (e.g., e.g., flow data in the case of a flow meter) and transmit the collected data every 24 hours. In the advanced mode, the meter encoder 120 may collect hourly meter data and transmit the collected data every 4 hours. In the pro mode, the meter encoder 120 may collect meter data every 15 minutes and transmit the collected data every hour. If the meter encoder 120 is battery operated, and due to power usage of the meter encoder 120's transmitter, the basic mode may, for example, have a 10 year battery life, the advanced mode, for example, may have a 3 year battery life, and the pro mode may, for example, have a 1 year battery life. A user may select a particular mode of operation of a meter encoder 120, via controlling device 110, and interface device 100 may configure the meter encoder 120 to operate in the selected mode via the one of communication ports 130-1 through 130-n to which the meter encoder 120 is connected. Operation in multiple different modes by the meter encoder 120 enables a user to customize the amount of reported meter data relative to a length of desired battery life for a battery-operated meter encoder 120.

Interface device 100 sends the command(s), instruction set(s), and/or data to the meter encoder 120, meter, or MIU connected to the selected communication port (block 630). For example, referring to FIG. 1, if meter encoder 120-1 is connected to the infrared port 130-1, then controller 200 of interface device 100 sends the command(s), instruction set(s) and/or data to the meter encoder 120-1 using infrared signaling over port 130-1. As another example, referring again to FIG. 1, if meter encoder 120-3 is inductively coupled to inductive port 130-3, then controller 200 of interface device 100 sends the command(s), instruction set(s), and/or data to the meter encoder 120-3 using inductive signaling over port 130-3.

Interface device 100 receives, via the selected communication port 130, an acknowledgement of completion of configuring, testing, programming, or reading of the connected meter encoder 120, meter, or MU and/or data associated with the configuring, testing, programming, or reading (block 635). For example, the meter encoder 120 upon receipt of the command(s), instruction set(s), and/or data from interface device 100 may send an acknowledgement that acknowledges receipt, and/or meter encoder 120 may execute the command(s) and/or instruction set(s) (possibly using the data) and, when execution is complete, send data acknowledging completion of the configuring, testing, or programming performed by execution of the command(s) and/or instruction set(s). In the case of testing, the data acknowledging completion of the testing may additionally include data of the testing results, such as data indicating that meter encoder 120 is operating within acceptable tolerances or limits. In the case of the reading of a meter associated with the meter encoder 120, the command sent to the meter encoder in block 630 may be a meter reading command, and the data returned from the meter encoder 120 in blocks 635 and 640 may include data associated with the particular requested meter reading (e.g., a particular meter reading of an associated water meter, power meter, etc.). Personnel may use the data in controlling device 110 to quickly determine that interface device 100 and/or meter encoders 120 are operating properly.

Interface device 100 sends, via the RF connection to the controlling device 110, the received configuration, testing, programming, or reading acknowledgement (block 640) and/or the data associated with the configuring, testing, programming, or reading. Controller 200 relays the configuration, testing, programming, or reading related data, received from the meter encoder 120, via RF signaling to the controlling device 110 connected to RF communication unit 205.

Figure 7A:
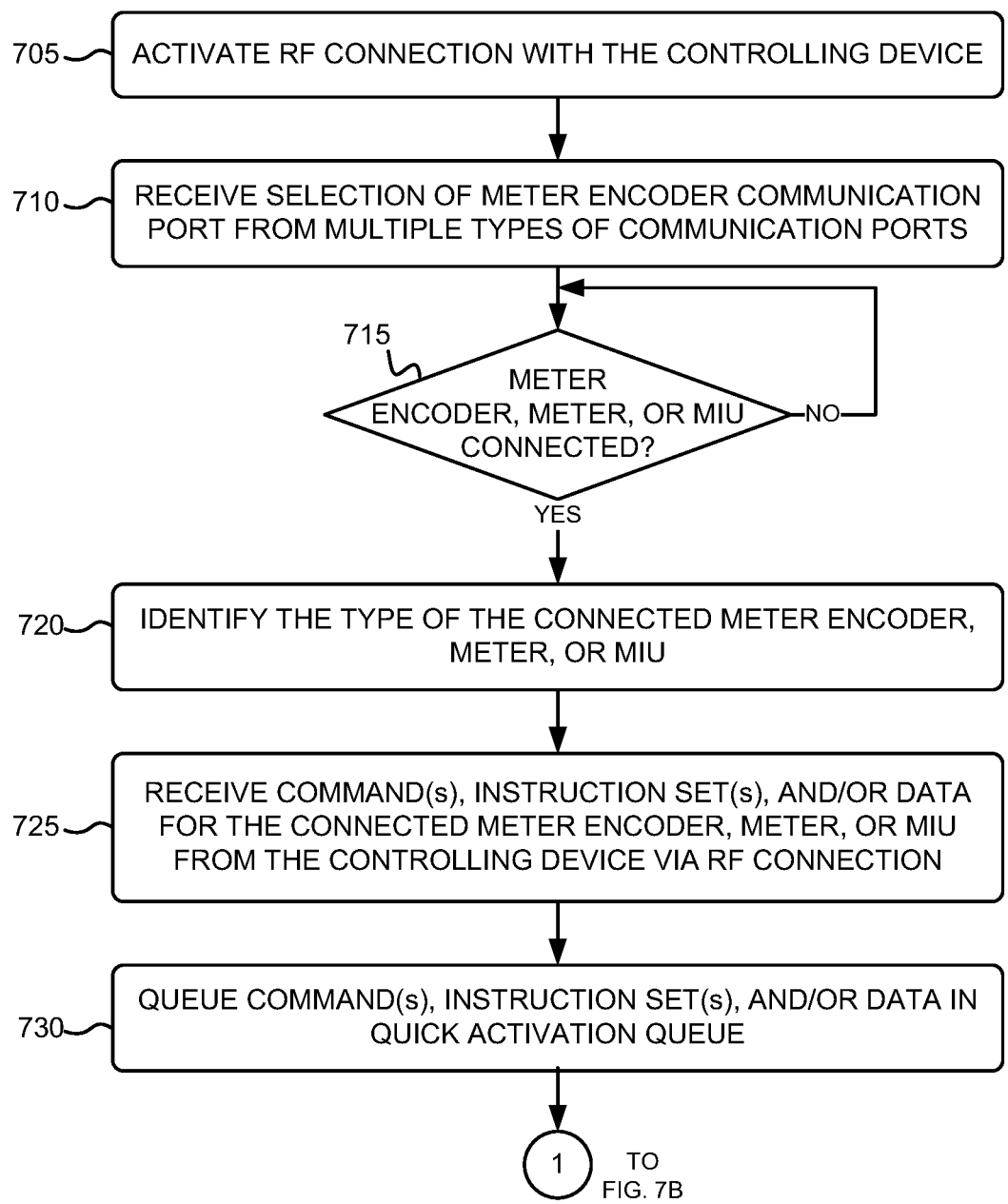
FIGS. 7A-7C are flow diagrams that illustrate an exemplary process for programming, configuring, testing and/or reading a meter encoder by a controlling device using the meter communication interface device and the interface device's quick activation button of FIGS. 3A and 3B.
Figure 7B:
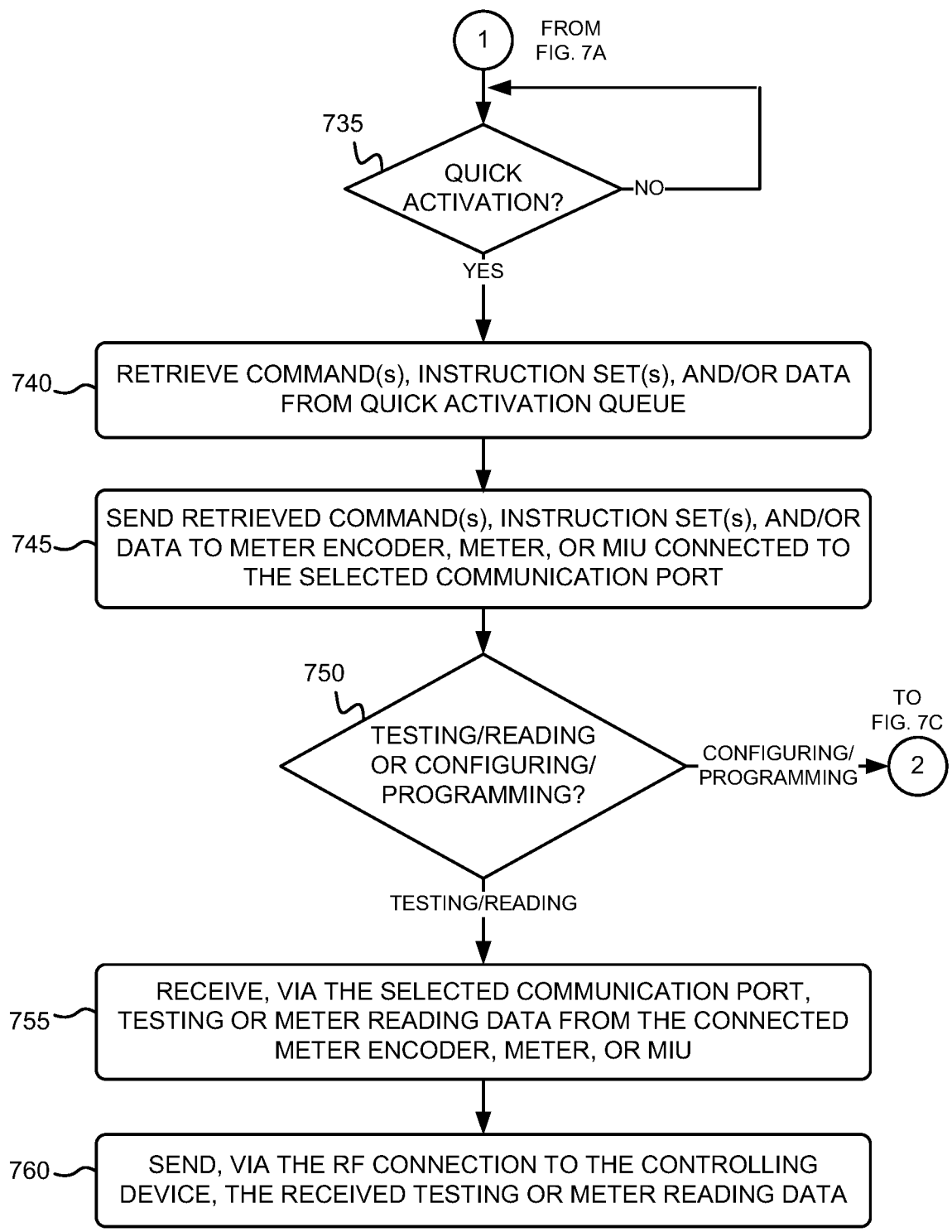
Figure 7C:
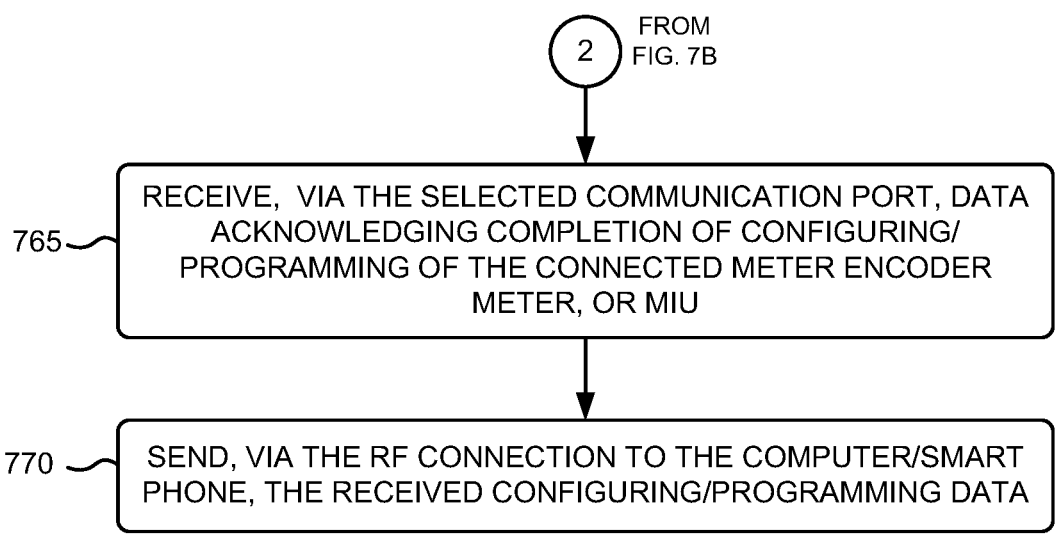

FIGS. 7A-7C are flow diagrams that illustrate an exemplary process for programming or testing a meter encoder 120 using quick activation button 300. The exemplary process of FIGS. 7A-7C may be implemented by meter communication interface device 100 in conjunction with a controlling device 110.

The exemplary process includes interface device 100 activating an RF connection with controlling device 110 (block 705). For example, if the RF connection includes a Bluetooth™ connection, and Bluetooth™ mode has been turned on at controlling device 110, RF communication unit 205 may "pair" with controlling device 110 to establish an RF Bluetooth™ connection.

Interface device 100 receives a selection of a communication port from multiple types of communication ports 130-1 through 130-n (block 710). In one implementation, controlling device 110 may send a selection of a communication port, from among ports 130-1 through 130-n, that is to be used to connect interface device 100 to a meter encoder 120, meter, or MIU. A user of controlling device 110 may, for example, enter the selection of the communication port, into a GUI implemented by controlling device 110, and the selection may be transmitted to interface device 100 via RF communication unit 205. In another implementation, interface device 100 may "test" each of communication ports 130-1 through 130-n (as similarly described above with respect to block 610 of FIG. 6A) for the presence of a meter encoder 120, meter, or MIU, and may select one of the communication ports 130-1 through 130-n based on detection of the presence of the meter encoder 120, meter, or MIU via the selected one of the communication ports 130.

Interface device 100 determines if a meter encoder 120, meter, or MIU has been connected to the selected communication port (block 715). In the case of infrared port 130-1, connection of the meter encoder 120-1 may include placement of interface device 100 in proximity to the meter encoder 120, with an unhindered line of sight between infrared port 130-1 and a corresponding infrared port on the meter encoder 120-1. In the case of wired port 130-2, connection of the meter encoder 120-2 may include insertion of one end of a cable (e.g., a serial cable) into wired port 130-2 and the other end of the cable into the corresponding wired port of the meter encoder 120-2. In the case of inductive port 130-3, connection of the meter encoder 120-3 may include placement of inductive port 130-3 of interface device 100 in close proximity to the corresponding inductive port of the meter encoder 120-3. Interface device 100 and the meter encoder 120 may engage in a "handshake," via the selected communication port 130, to establish a connection between interface device 100 and the meter encoder 120.

If a meter encoder 120, meter, or MIU has not been connected to the selected communication port (NO—block 715), interface device 100 waits until the meter encoder 120, meter, or MIU is connected. If the meter encoder 120, meter, or MIU has been connected (YES 13 block 715), then interface device 100 identifies the type of the connected meter encoder 120, meter, or MIU (block 720). Interface device 100 may, for example, query the meter encoder 120 to obtain an identifier of the meter encoder 120 that can be used to determine the type of the meter encoder 120 (e.g., a model number, a version number, etc.).

Interface device 100 receives a command(s), instruction set(s), and/or data, for the connected meter encoder 120, meter, or MIU, from controlling device 110 via the RF connection (block 725) and queues the received command(s), instruction set(s), and/or data in quick activation queue 400 (block 730). In some circumstances, a user of controlling device 110 may, based on the type of meter encoder, meter, or MIU configuration, testing, reading, or programming to be performed, select one or more particular commands, instruction sets, and/or data to be sent for storage in quick activation queue 400. The type and content of the command(s), instruction set(s) and/or data may be dependent on the meter encoder, meter, or MIU configuration, programming, reading and/or testing that the user desires to have performed. In other circumstances, controlling device 110 may automatically select one or more particular commands, instructions sets, and/or data depending on the type of the meter encoder 120, meter, or MIU determined in block 720. The user of controlling device 110 may select an entire series of command(s), instruction set(s), and/or data for storage in quick activation queue 400 for subsequent activation by one or more selections of quick activation button 300. For example, a command/instruction sequence may be entered by the user as follows: command_1, instruction_set_1, command_2, instruction_set_2, instruction_set_3, where each command or instruction set in the sequence is to be activated by successive selections of quick activation button 300. Referring to FIG. 4, command_1 may be stored in queue entry 410-1 (i.e., the "top" of queue 400), instruction_set_1 may be stored in queue entry 410-2, command_2 may be stored third in queue entry 410-3, instruction_set_2 may be stored in queue entry 410-4, and instruction_set_3 may be stored in queue entry 410-5.

In the case of configuring a connected meter encoder 120, meter, or MIU the user of controlling device 110 may set, or change, a mode of the meter encoder 120, meter, or MIU when the meter encoder 120, meter, or MIU is capable of operating in multiple different modes. For example, if a meter encoder 120 is capable of operating in the basic, advanced, and pro modes described above, the user of controlling device 110 may select one of the basic, advanced, or pro modes, and interface device 100 may configure the meter encoder 120 to operate in the selected mode via the one of communication ports 130-1 through 130-n to which the meter encoder 120 is connected.

Interface device 100 determines if quick activation has been selected (block 735)(FIG. 7B). Quick activation may be selected by a user of interface device 100 via selection (e.g., pressing) of quick activation button 300. Alternatively, controlling device 110 may send a quick activation signal to interface device 100 to cause selection of the quick activation function. If quick activation has been selected (YES—block 735), then controller 200 of interface device 100 retrieves a command(s), instruction set(s) and/or data from the top entry(ies) of quick activation queue 400 (block 740). If quick activation has not been selected (NO—block 735), then controller 200 of interface device 100 waits until the quick activation button 300 has been selected.

Interface device 100 sends the retrieved command(s), instruction set(s), and/or data to the meter encoder 120, meter, or MIU connected to the selected communication port (block 745). For example, referring to FIG. 1, if meter encoder 120-1 is connected to the infrared port 130-1, then controller 200 of interface device 100 sends the retrieved command(s), instruction set(s) and/or data to the meter encoder 120-1 using infrared signaling over port 130-1.

If the command(s), instruction set(s) and/or data relates to testing or reading of the meter encoder 120, meter, or MIU (TESTING/READING—block 750), then interface device 100 receives, via the selected communication port, testing or meter reading data from the connected meter encoder 120, meter, or MIU (block 755). Referring to the previous example, if the command(s), instruction set(s), and/or data sent to meter encoder 120-1 via infrared port 130-1 relates to testing to be performed at meter encoder 120-1, then meter encoder 120-1 performs the testing in accordance with the command(s), instruction set(s) and/or data, and returns, via infrared port 130-1, data indicating results of the testing to interface device 100. If the command(s), instruction set(s), and/or data sent to meter encoder 120-1 via infrared port 130-1 relates to reading a meter associated with meter encoder 120-1, then meter encoder 120-1 obtains the meter reading data from the meter in accordance with the command(s), instruction(s) and/or data and returns, via infrared port 130-1, the meter reading data to interface device 100. Controller 200 of interface device 100 then sends the received testing or meter reading data to the controlling device 110 via the RF connection established by RF communication unit 205 (block 760).

If the command(s), instruction set(s) and/or data relates to configuring/programming of the meter encoder 120, meter, or MIU (CONFIGURING/PROGRAMMING—block 750), then interface device 100 receives, via the selected communication port 130, data acknowledging completion of the configuring/programming of the connected meter encoder 120, meter, or MIU (block 765)(FIG. 7C). For example, referring to the previous example, if the command(s), instruction set(s), and/or data sent to meter encoder 120-1 via infrared port 130-1 relates to programming of meter encoder 120-1, then meter encoder 120-1 programs itself in accordance with the command(s), instruction set(s), and/or data, and returns an acknowledgement, via infrared port 130-1, indicating that the configuring/programming has successfully completed. Controller 200 of interface device 100 then sends the received configuring/programming acknowledgement to the controlling device 110 via the RF connection established by RF communication unit 205 (block 770).

The foregoing description of implementations provides illustration and description, but is not intended to be exhaustive or to limit the invention to the precise form disclosed. Modifications and variations are possible in light of the above teachings or may be acquired from practice of the invention. For example, while series of blocks have been described with respect to FIGS. 6A, 6B, 7A, 7B, and 7C, the order of the blocks may be varied in other implementations. Moreover, non-dependent blocks may be performed in parallel.

Certain features described above may be implemented as "logic," a "unit," or a "controller" that performs one or more functions. This logic, unit, or controller may include hardware, such as one or more processors, microprocessors, microcontrollers, application specific integrated circuits, or field programmable gate arrays, software, or a combination of hardware and software.

No element, act, or instruction used in the description of the present application should be construed as critical or essential to the invention unless explicitly described as such. Also, as used herein, the article "a" is intended to include one or more items. Further, the phrase "based on" is intended to mean "based on, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A communication interface device, comprising:
a radio frequency (RF) communication unit configured to receive, via RF signaling, at least one of first commands, instructions or data destined for a first meter encoder, meter, or meter interface unit (MIU);
a plurality of different types of communication ports; and
a controller configured to:
send a probe signal to each of the plurality of different types of communication ports,
detect a responsive signal, via a first communication port of the plurality of different types of communication ports, from the first meter encoder, meter, or MIU,
select the first communication port from the plurality of different types of communication ports based on the detected responsive signal, and
send, via the selected first communication port using a first communication mechanism, the at least one of first commands, instructions or data to the first meter encoder, meter, or MIU.

2. The communication interface device of claim 1, wherein the RF communication unit is further configured to:
receive, via RF signaling, at least one of second commands, instructions or data destined for a second meter encoder, meter, or MIU, and
wherein the controller is further configured to:
select a second communication port from the plurality of different types of communication ports, and
send, via the selected second communication port using a second communication mechanism, the at least one of second commands, instructions or data to the second meter encoder, meter, or MIU.

3. The communication interface device of claim 2, wherein the first communication port comprises an infrared port and the first communication mechanism comprises infrared signaling and the second communication port comprises one of an inductive port, a radio frequency port, or a wired port.

4. The communication interface device of claim 2, wherein the first communication port comprises an inductive port and the first communication mechanism comprises inductive signaling, and the second communication port comprises one of an infrared port, a radio frequency port, or a wired port.

5. The communication interface device of claim 2, wherein the RF communication unit is further configured to:
receive, via RF signaling, at least one of third commands, instructions or data destined for a third meter encoder, meter, or MIU, and
wherein the controller is further configured to:
select a third communication port from the plurality of different types of communication ports, and
send, via the selected third communication port using a third communication mechanism, the at least one of third commands, instructions or data to the third meter encoder, meter, or MIU.

6. The communication interface device of claim 5, wherein the first communication port comprises an infrared port and the first communication mechanism comprises infrared signaling, the second communication port comprises an inductive port and the second communication mechanism comprises inductive signaling, and the third communication port comprises a wired port and the third communication mechanism comprises electrical signaling.

7. The communication interface device of claim 1, wherein the RF communication unit comprises a Bluetooth™ transceiver that communicates using a Bluetooth™ Low Energy (BLE) serial link.

8. The communication interface device of claim 1, wherein the at least one of first commands, instructions, or data relate to testing the first meter encoder or reading the first meter, and wherein the controller is further to:
receive, via the first communication port from the first meter encoder, data associated with testing performed at the first meter encoder, or data associated with meter reading performed by the first meter.

9. The communication interface device of claim 1, wherein the plurality of different types of communication ports comprises an infrared port, an inductive port, an RF port, and a wired port.

10. The communication interface device of claim 9, wherein the controller is further configured to:
  detect a presence of the first meter encoder, meter, or MIU, based on the responsive signal, subsequent to at least one of:
    placement of the communication interface device in proximity to the first meter encoder, meter or MIU with an unhindered line of sight between the infrared port and a corresponding infrared port on the first meter encoder, meter, or MIU,
    placement of the inductive port of the communication interface device in proximity to a corresponding inductive port on the first meter encoder, meter or MIU,
    placement of the communication interface device in proximity to the first meter encoder, meter, or MIU to enable short range RF communication between the RF port of the communication interface device and a corresponding RF port of the first meter encoder, meter, or MIU, or
    connection of a cable between the wired port of the communication interface device and a corresponding wired port of the first meter encoder, meter, or MIU.

11. The communication interface device of claim 1, where the controller is further configured to:
  query, via the first communication port of the plurality of different types of communication ports, the first meter encoder, meter, or MIU to identify a type of meter encoder, meter, or MIU of the first meter encoder, meter, or MIU,
  select ones of the first commands, instructions, or data to send to the first meter encoder, meter, or MIU based on the identified type of meter encoder, meter, or MIU, and
  wherein, when sending the at least one of first commands, instructions, or data, the controller further:
    sends, via the first communication port of the plurality of different types of communication ports, the selected ones of the first commands, instructions, or data to the first meter encoder, meter, or MIU.

12. A device, comprising:
  a radio frequency (RF) communication unit to communicate with a controlling device via RF signaling;
  a plurality of communication ports to communicate with a plurality of meter encoders, meters, or meter interface units (MIUs) using a plurality of different communication mechanisms, wherein the plurality of communication ports comprises an infrared port, an inductive port, and a wired port; and
  a controller to:
    store and forward at least one of commands, instructions, or data received from the controlling device, via the RF communication unit, to a first meter encoder, meter, or MIU of the plurality of meter encoders, meters, or MIUs via a first communication port of the plurality of communication ports; and
    store and forward an acknowledgement or data received from the first meter encoder, meter, or MIU via the first communication port to the controlling device via the RF communication unit.

13. The device of claim 12, wherein the plurality of communication ports further comprises a RF communication port.

14. The device of claim 12, wherein the RF communication unit comprises a Bluetooth™ transceiver that communicates using a Bluetooth™ Low Energy (BLE) serial link.

15. A method, comprising:
  receiving, by a meter communication interface device via radio frequency (RF) signaling, at least one of first commands, instructions or data destined for a first meter encoder, meter, or meter interface unit (MIU);
  selecting, by the meter communication interface device, a first communication port from multiple communication ports residing at the meter communication interface device, wherein the multiple communication ports comprise multiple different types of communication ports, and wherein selecting the first communication port from the multiple communication ports further comprises:
    sending a probe signal to each of the multiple communication ports,
    detecting a responsive signal from the first meter encoder, meter, or MIU via the first communication port of the multiple communication ports, and
    selecting the first communication port based on the detected responsive signal; and
  sending, via the selected first communication port of the meter communication interface device using a first communication mechanism, the at least one of first commands, instructions or data to the first meter encoder, meter, or MIU.

16. The method of claim 15, further comprising:
  selecting, by the meter communication interface device, a second communication port from the multiple communication ports residing at the meter communication interface device;
  receiving, by the meter communication interface device via RF signaling, at least one of second commands, instructions or data destined for a second meter encoder, meter, or MIU; and
  sending, via the selected second communication port of the meter communication interface device using a second communication mechanism that is different than the first communication mechanism, the at least one of second commands, instructions or data to the second meter encoder, meter, or MIU.

17. The method of claim 16, wherein the first communication port comprises an infrared port and the first communication mechanism comprises infrared signaling and the second communication port comprises an inductive port, a radio frequency port, or a wired port.

18. The method of claim 16, wherein the first communication port comprises an inductive port and the first communication mechanism comprises inductive signaling, and the second communication port comprises one of an infrared port, a radio frequency port, or a wired port.

19. The method of claim 16, further comprising:
  selecting, by the meter communication interface device, a third communication port from the multiple communication ports residing at the meter communication interface device;
  receiving, by the meter communication interface device via RF signaling, at least one of third commands, instructions or data destined for a third meter encoder, meter, or MIU; and
  sending, via the third communication port of the meter communication interface device using a third communication mechanism that is different than the first and the second communication mechanisms, the at least one of third commands, instructions or data to the third meter encoder, meter, or MIU.

20. The method of claim 19, wherein the first communication port comprises an infrared port and the first communication mechanism comprises infrared signaling, the second communication port comprises an inductive port and the second communication mechanism comprises inductive signaling, and the third communication port comprises a wired port and the third communication mechanism comprises electrical signaling.

21. The method of claim 15, wherein the multiple communication ports comprise an infrared port and an inductive port and wherein detecting the responsive signal from the first meter encoder, meter, or MIU via the first communication port of the multiple communication ports occurs subsequent to one of:
   placement of the meter communication interface device in proximity to the first meter encoder, meter or MIU with an unhindered line of sight between the infrared port and a corresponding infrared port on the first meter encoder, meter, or MIU, or
   placement of the inductive port of the meter communication interface device in proximity to a corresponding inductive port on the first meter encoder, meter or MIU.

22. The method of claim 15, wherein the multiple communication ports further comprise an infrared port, an inductive port, a RF port, and a wired port, and wherein detecting the responsive signal from the first meter encoder, meter, or MIU via the first communication port of the multiple communication ports occurs subsequent to one of:
   placement of the meter communication interface device in proximity to the first meter encoder, meter or MIU with an unhindered line of sight between the infrared port and a corresponding infrared port on the first meter encoder, meter, or MIU,
   placement of the inductive port of the meter communication interface device in proximity to a corresponding inductive port on the first meter encoder, meter or MIU,
   placement of the meter communication interface device in proximity to the first meter encoder, meter, or MIU to enable short range RF communication between the RF port of the meter communication interface device and a corresponding RF port of the first meter encoder, meter, or MIU, or
   connection of a cable between the wired port of the meter communication interface device and a corresponding wired port of the first meter encoder, meter, or MIU.

23. A communication interface device, comprising:
   a plurality of different types of communication ports;
   a radio frequency (RF) communication unit configured to:
      receive, via RF signaling, at least one of first commands, instructions or data destined for a first meter encoder, meter, or meter interface unit (MIU), and
      receive, from another device, a transmitted selection of a first communication port from the plurality of different types of communication ports; and
   a controller configured to:
      select the first communication port from the plurality of different types of communication ports based on the receipt of the transmitted selection from the other device, and
      send, via the selected first communication port using a first communication mechanism, the at least one of first commands, instructions or data to the first meter encoder, meter, or MIU.

24. A communication interface device, comprising:
   a radio frequency (RF) communication unit configured to:
      receive, via RF signaling, at least one of first commands, instructions or data destined for a first meter encoder, meter, or meter interface unit (MIU) and
      wherein the at least one of first commands, instructions, or data relate to programming the first meter encoder, meter, or MIU;
   a plurality of different types of communication ports; and
   a controller configured to:
      select a first communication port from the plurality of different types of communication ports,
      send, via the selected first communication port using a first communication mechanism, the at least one of first commands, instructions or data to the first meter encoder, meter, or MIU, and
      receive, via the first communication port from the first meter encoder, meter, or MIU, data acknowledging completion of the programming of the first meter encoder, meter, or MIU.

25. A communication interface device, comprising:
   a radio frequency (RF) communication unit configured to receive, via RF signaling, at least one of first commands, instructions or data destined for a first meter encoder, meter, or meter interface unit (MIU);
   a memory configured to store the received at least one of first commands, instructions or data in a queue;
   a plurality of different types of communication ports; and
   a controller configured to:
      select a first communication port from the plurality of different types of communication ports,
      receive selection of a quick activation function,
      retrieve the at least one of first commands, instructions or data from the queue, based on the selection of the quick activation function, for sending to the first meter encoder, meter, or MIU via the selected first communication port using a first communication mechanism, and
      send, via the selected first communication port using the first communication mechanism, the at least one of first commands, instructions or data to the first meter encoder, meter, or MIU.

26. A method, comprising:
   receiving, by a meter communication interface device via radio frequency (RF) signaling, at least one of first commands, instructions or data destined for a first meter encoder, meter, or meter interface unit (MIU);
   selecting, by the meter communication interface device, a first communication port from multiple communication ports residing at the meter communication interface device, wherein the multiple communication ports comprise multiple different types of communication ports and wherein the selecting the first communication port from the multiple communication ports further comprises:
      receiving, from another device, a transmitted selection of the first communication port from the multiple communication ports; and
      selecting the first communication port based on the receipt of the transmitted selection from the other device; and
   sending, via the selected first communication port of the meter communication interface device using a first communication mechanism, the at least one of first commands, instructions or data to the first meter encoder, meter, or MIU.

27. A method, comprising:
   receiving, by a meter communication interface device via radio frequency (RF) signaling, at least one of first commands, instructions or data destined for a first meter encoder, meter, or meter interface unit (MIU);

storing the received at least one of first commands, instructions or data in a queue;

receiving, by the meter communication interface device, selection of a quick activation function;

selecting, by the meter communication interface device, a first communication port from multiple communication ports residing at the meter communication interface device, wherein the multiple communication ports comprise multiple different types of communication ports;

retrieving the at least one of first commands, instructions or data from the queue based on selection of the quick activation function for sending to the first meter encoder, meter, or MIU; and sending, via the selected first communication port of the meter communication interface device using a first communication mechanism, the at least one of first commands, instructions or data to the first meter encoder, meter, or MIU.

* * * * *